United States Patent [19]
Miskin et al.

[11] 4,331,892
[45] May 25, 1982

[54] MONOLITHIC INTEGRATED CIRCUIT FOR A DIGITAL-TO-ANALOG CONVERTER

[75] Inventors: Leslie Miskin, Gundelfingen; Mauritz F. Schenstrom, Lahr-Langenwinkel; Detlev Kunz, Freiburg, all of Fed. Rep. of Germany

[73] Assignee: ITT Industries, Inc., New York, N.Y.

[21] Appl. No.: 127,624

[22] Filed: Mar. 6, 1980

[30] Foreign Application Priority Data

Apr. 4, 1979 [DE] Fed. Rep. of Germany ....... 2914108

[51] Int. Cl.³ .......................................... H03K 13/02
[52] U.S. Cl. ................................. 307/448; 307/297; 340/347 DA
[58] Field of Search ............... 307/297, 304, 242, 448; 340/347 DA

[56] References Cited

U.S. PATENT DOCUMENTS 3,223,993 12/1965 Dahlberg, Jr. .............. 340/347 DA
3,241,133 3/1966 Herzl ........................ 340/347 DA
3,940,760 2/1976 Brokaw ............................. 307/297
4,267,550 5/1981 Cecil ........................... 340/347 DA

OTHER PUBLICATIONS

Reiner, R. "Mos-Integrierbare Digital-Analog-Wandler" Funk-Technik, 30, #8, 1975, pp. 217-219.

*Primary Examiner*—William H. Punter
*Attorney, Agent, or Firm*—John T. O'Halloran; Peter C. Van Der Sluys

[57] ABSTRACT

A monolithic integrated digital-to-analog converter is provided wherein the resistors are replaced by insulated-gate field-effect transistors thus avoiding any detrimental effects of variation between supposedly identical components. The equivalent resistance values of the insulated-gate field-effect transistors are determined by a fixed ratio of channel width to channel length.

2 Claims, 2 Drawing Figures

MONOLITHIC INTEGRATED CIRCUIT FOR A DIGITAL-TO-ANALOG CONVERTER

BACKGROUND OF THE INVENTION

The present invention concerns a monolithic integrated digital-to-analog converter in which resistances and switches are represented by insulated-gate field-effect transistors. Reference is made to the periodical "Funk-Technik" 30, No. 8, 1975, pp. 217 to 219.

German Pat. No. 2,059,933 teaches use of insulated-gate field-effect transistors whose resistance values are determined by a fixed ratio of channel width to channel length for the resistances in MOS digital-to-analog converters.

The invention relates to a monolithic integrated circuit for a digital-to-analog converter of such a type.

When such monolithic integrated circuits are mass-produced by separating semiconductor wafers into chips containing the individual circuits, a problem arises. The output signals of the converters vary as a result of manufacturing conditions, which may lead to considerable variations in yield. It has been found that variations over a single wafer are a minor problem, while those over a plurality of wafers may be considerable.

OBJECTIVE OF THE INVENTION

Accordingly, the object of the invention is to provide a monolithic integrated circuit which considerably reduces the effects of the varying manufacturing conditions on the yield during mass production of the above kind.

According to the invention, this object is achieved by a novel circuit arrangement as described herein.

SUMMARY OF THE INVENTION

Generally, in a monolithic integrated circuit for a digital-to-analog converter, comprising resistances connected in parallel and represented by insulated-gate field-effect transistors whose output currents are determined by a fixed ratio of channel width to channel length and whose source-drive currents are each controlled with a switching transistor designed as an insulated-gate field-effect transistor where the channel of each of the enhancement mode transistors and the channel of a respective additional switching transistor in series are connected between output potential and ground potential and where the gate electrodes of the saturated field effect transistors are connected to the gate and drain electrodes of an additional enhancement-mode insulated-gate field-effect transistor whose channel is connected between a constant current source and ground potential and whose W/L ratio is equal to that of the field effect transistor having the smallest W/L ratio.

The constant current source is preferably a conventional, temperature-compensated constant current source which can be implemented with integrated-circuit technology.

The additional insulated-gate field-effect transistors in the monolithic integrated circuit according to the invention compensate for variations of manufacturing conditions, but since the current sources used are saturated enhancement-mode insulated-gate field-effect transistors, their resistance values are dependent on the variations of the voltage Vo at the drain electrodes, which variations affect the effective channel length L.

In a preferred embodiment of the monolithic integrated circuit according to the invention, these variations in channel lengths are compensated by connecting the additional insulated-gate field-effect transistor in series with the channel of an enhancement-mode insulated-gate field-effect transistor used as a regulating transistor and having its gate electrode connected to output potential.

The monolithic integrated circuit according to the invention will now be explained with reference to the accompanying drawing.

DESCRIPTION OF THE PREFERRED EMBODIMENT

Figure 1:
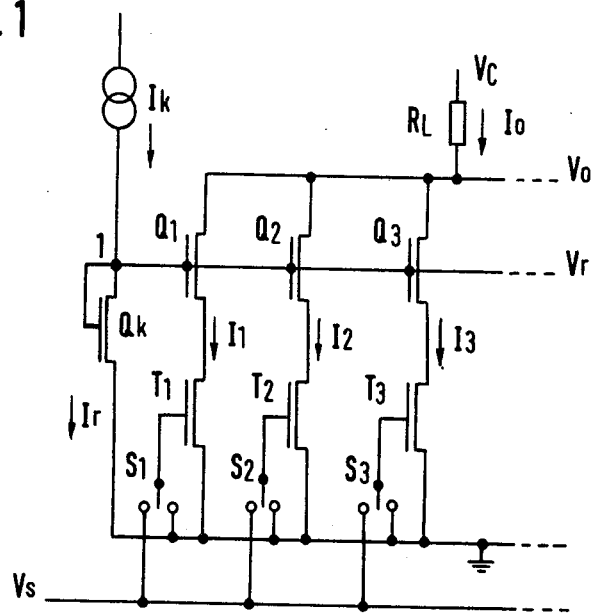
FIG. 1 is a schematic diagram of the monolithic integrated circuit according to the invention.

The monolithic integrated digital-to-analog converter contains a plurality of insulated-gate field-effect transistors (Q1, T1; Q2, T2; Q3, T3) having their channels connected in series; three of these series combinations are shown in the figures of the drawing. These series combinations are connected between output potential Vo and ground. The output potential Vo drops across the load resistor $R_L$, which is connected to the voltage $V_C$ and traversed by the current Io.

As in the prior art disclosed in the above-mentioned German Pat. No. 20 59 933, resistances are represented by the upper insulated-gate field-effect transistors Q1, Q2, Q3, ..., which are connected to output potential Vo and whose currents are determined by a fixed ratio of channel width to channel length. However, these transistors Q1, Q2, Q3, ... are used in their saturated conditions. Their gates are connected in common to the control potential Vr, which is taken off the junction point 1 of a series combination of a current source Ik and an additional insulated-gate field-effect transistor Qk, through the flows the control current Ir. The junction point 1 of the current source Ik and the additional insulated-gate field-effect transistor is connected to the drain and gate of this transistor.

Using the known relation for the source-drain currents of the insulated-gate field-effect transistors Qk, Q1, Q2, Q3, $$In = K \cdot \frac{Wk}{Lk} (V_{GS} - V_t)^2$$

cf. "SCP and Solid-State Technology", November 1966, pp 33 to 38, where Vt=threshold voltage, and K=Co $\mu$/2, it can be shown that $$In = Ik \frac{Wn/Ln}{Wk/Lk},$$

from which it is apparent that the variables depend upon manufacturing conditions, namely the threshold voltage Vt and the specific capacitance Co and, consequently, their variations are eliminated. In the above equation $\mu$ represents the carrier mobility in the channel.

Since the load resistor $R_L$ is subject to the same manufacturing variations, a problem arises inasmuch as the output potential Vo is subject to these variations, too. The variations in output potential Vo cause variations in the effective channel lengths L of the field-effect transistors Q1, Q2, Q3, since the effective channel length L is equal to the distance between the source and drain regions minus the voltage-dependent depletion zone of the drain region. For values differing from Vo by $\Delta$ Vo, the channel length variations of the field-effect transistors Q1, Q2, Q3, are different from those of the additional insulated-gate field-effect transistor Qk.

Large values of the channel length L improve accuracy, since the relative change in channel length caused by $\Delta$ Vo decreases. Once the W/L ratios are fixed, the influence of $\Delta$ Vo will decrease as the W-by-L product, i.e., the channel area, increases.

Vr is thus subject to temperature and manufacturing variations, which affects the source currents flowing through the field-effect transistors Q1, Q2, Q3, but not the ratios of these currents.

Figure 2:
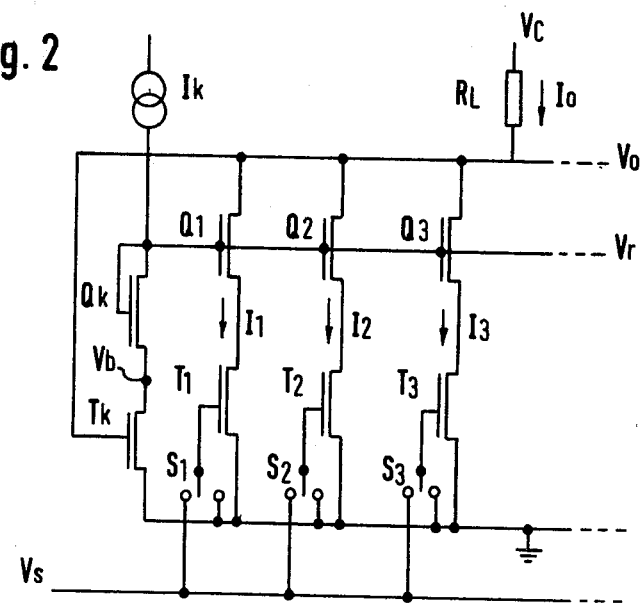
FIG. 2 is a schematic diagram of the aforementioned preferred embodiment of the monolithic integrated circuit according to the invention.

The circuit of FIG. 2 differs from that of FIG. 1 in that the additional insulated-gate field-effect transistor Qk is connected in series with the channel of a regulating transistor Tk designed as an insulated-gate field-effect transistor. The gate of this regulating transistor is connected to output potential Vo, while the source is grounded. This regulating transistor Tk serves to compensate for variations in effective channel length caused by variations in supply potential $\Delta$ Vo.

This compensation is achieved by applying feedback from Vo to Vr through the regulating transistor Tk. Without this regulating transistor Tk, the currents I1, I2, and I3 would decrease with decreasing Vo, since the effective channel length of the transistors Q1, Q2, and Q3 increases as a result of the reduction of the depletion zone at the PN junction of the drain region.

By this feedback via the regulating transistor Tk, however, the variations in channel length can only be compensated in part since the potential Vb rises with decreasing Vo, thereby increasing the threshold voltage Vt by a factor determined by the substrate effect. The currents flowing in the field-effect transistors Q1, Q2, Q3, rise as the threshold value Vt of the additional insulated-gate field-effect transistor Qk increases. Therefore, the above-described compensation using the circuit of FIG. 2 will be satisfactory over only a limited range of the supply potential Vo.

We claim:

1. A monolithic integrated circuit for a digital-to-analog converter, comprising a plurality of resistances connected in parallel, said resistance comprising a plurality of first enhancement mode insulated-gate field-effect transistors connected in parallel and having output currents, when operated in saturated condition, determined by a fixed ratio of channel width to channel length and source-drain currents controlled by a respective switching transistor comprising a second insulated-gate field-effect transistor, wherein the channel of each of the first enhancement mode insulated-gate field-effect transistors and the channel of said respective switching transistor in series with each first enhancement-mode insulated-gate field-effect transistor are connected between output potential and ground potential, and the gate electrodes of the first enhancement mode insulated gate field-effect transistors are connected to the gate and drain electrodes of an additional enhancement-mode insulated-gate field-effect transistor whose channel is connected between a constant current source and ground potential, and the channel width to channel length ratio of said additional enhancement mode insulated gate field effect transistor is equal to that of the first enhancement mode insulated gate field-effect transistor having the smallest channel width to channel length ratio.

2. A monolithic integrated circuit as claimed in claim 1, wherein the additional enhancement mode insulated-gate field-effect transistor is connected in series with the channel of a regulating transistor whose gate electrode is connected to output potential.

* * * * *